(12) United States Patent
Lin

(10) Patent No.: US 6,712,130 B2
(45) Date of Patent: Mar. 30, 2004

(54) CPU COOLING STRUCTURE

(75) Inventor: Shih-Jen Lin, Taipei (TW)

(73) Assignee: Global WIN Technology Co., Ltd., Taipei (TW)

( * ) Notice: Subject to any disclaimer, the term of this patent is extended or adjusted under 35 U.S.C. 154(b) by 0 days.

(21) Appl. No.: 10/184,993

(22) Filed: Jul. 1, 2002

(65) Prior Publication Data

US 2004/0000395 A1 Jan. 1, 2004

(51) Int. Cl.[7] .................................................. F24B 1/06
(52) U.S. Cl. ....................... 165/125; 165/121; 165/80.3; 361/697; 257/722; 174/16.3
(58) Field of Search ................................ 165/80.3, 185, 165/121, 122, 125; 361/704, 697; 257/722; 174/16.3

(56) References Cited

U.S. PATENT DOCUMENTS

| | | | | |
|---|---|---|---|---|
| 4,672,509 A | * | 6/1987 | Speraw | 165/122 |
| 5,535,094 A | * | 7/1996 | Nelson et al. | 361/697 |
| 5,563,768 A | * | 10/1996 | Perdue | 361/695 |
| 6,041,853 A | * | 3/2000 | Edayoshi et al. | 165/122 |
| 6,246,579 B1 | * | 6/2001 | Lin | 361/695 |
| 6,515,858 B2 | * | 2/2003 | Rodriguez et al. | 361/695 |
| 2003/0030980 A1 | * | 2/2003 | Bird et al. | 361/694 |

* cited by examiner

*Primary Examiner*—Terrell McKinnon
(74) *Attorney, Agent, or Firm*—Birch, Stewart, Kolasch & Birch, LLP

(57) ABSTRACT

A CPU cooling structure is constructed to include a heat sink adapted for mounting on a motherboard to absorb heat from a CPU of the motherboard, a fan provided above the heat sink and adapted for causing currents of air toward the heat sink to carry heat away from the heat sink, and a flow guide mounted on the heat sink to hold the fan above the heat sink, the flow guide having two flow guide holes and an air damper suspended in between the flow guide holes and adapted for guiding air from the fan toward the center area of the heat sink for enabling air to flow through air passages in the heat sink in reversed directions to carry heat away from the heat sink.

9 Claims, 13 Drawing Sheets

CPU COOLING STRUCTURE

BACKGROUND OF THE INVENTION

1. Field of the Invention

The present invention relates to a CPU cooling structure adapted for dissipating heat from the CPU of a motherboard and, more particularly to such a CPU cooling structure, which uses flow guide means to guide induced currents of air in the assigned direction so that heat can effectively rapidly be carried away from the CPU.

2. Description of the Related Art

Advanced computers provide sophisticated functions and rapid operational speed. During the operation of the CPU of the motherboard of a computer, much heat is produced. In order not to affect normal functioning of the CPU, heat must be quickly carried away from the CPU during the operation of the computer. Various heat sinks have been disclosed for this purpose. FIG. 13 illustrates the use of a heat sink with a fan for cooling the CPU of a motherboard. According to this design, the heat sink comprises a plurality of upright radiation fins upwardly extended from a flat base thereof and arranged in parallel. When the fan started, the induced axial flow of air flows toward parallel air passages in the heat sink between each two adjacent upright radiation fins. This design of CPU cooling structure is not satisfactory in function. When induced currents of air flew into air passages in the heat sink, they tend to meet at the center area of the heat sink, thereby causing heat source to be accumulated in the center area of the heat sink.

SUMMARY OF THE INVENTION

The present invention has been accomplished to provide a CPU cooling structure, which eliminates the aforesaid problem. It is one object of the present invention to provide a CPU cooling structure, which effectively carries heat away from the CPU, preventing accumulation of heat source in the center area of the heat sink. It is another object of the present invention to provide a CPU cooling structure, which uses flow guide means to guide induced currents of air in the assigned direction so that heat can effectively rapidly be carried away from the CPU. According to one aspect of the present invention, the CPU cooling structure comprises include a heat sink adapted for mounting on a motherboard to absorb heat from a CPU of the motherboard, a fan provided above the heat sink and adapted for causing currents of air toward the heat sink to carry heat away from the heat sink, and a flow guide mounted on the heat sink to hold the fan above the heat sink, the flow guide having two flow guide holes and an air damper suspended in between the flow guide holes and adapted for guiding air from the fan toward the center area of the heat sink for enabling air to flow through air passages in the heat sink in reversed directions to carry heat away from the heat sink. According to another aspect of the present invention, the air damper has a wave-like profile, defining a with-wind face and an against-wind face at each of two opposite sides thereof for guiding currents of air toward the center area of the heat sink.

DETAILED DESCRIPTION OF THE PREFERRED EMBODIMENT

Figure 1:
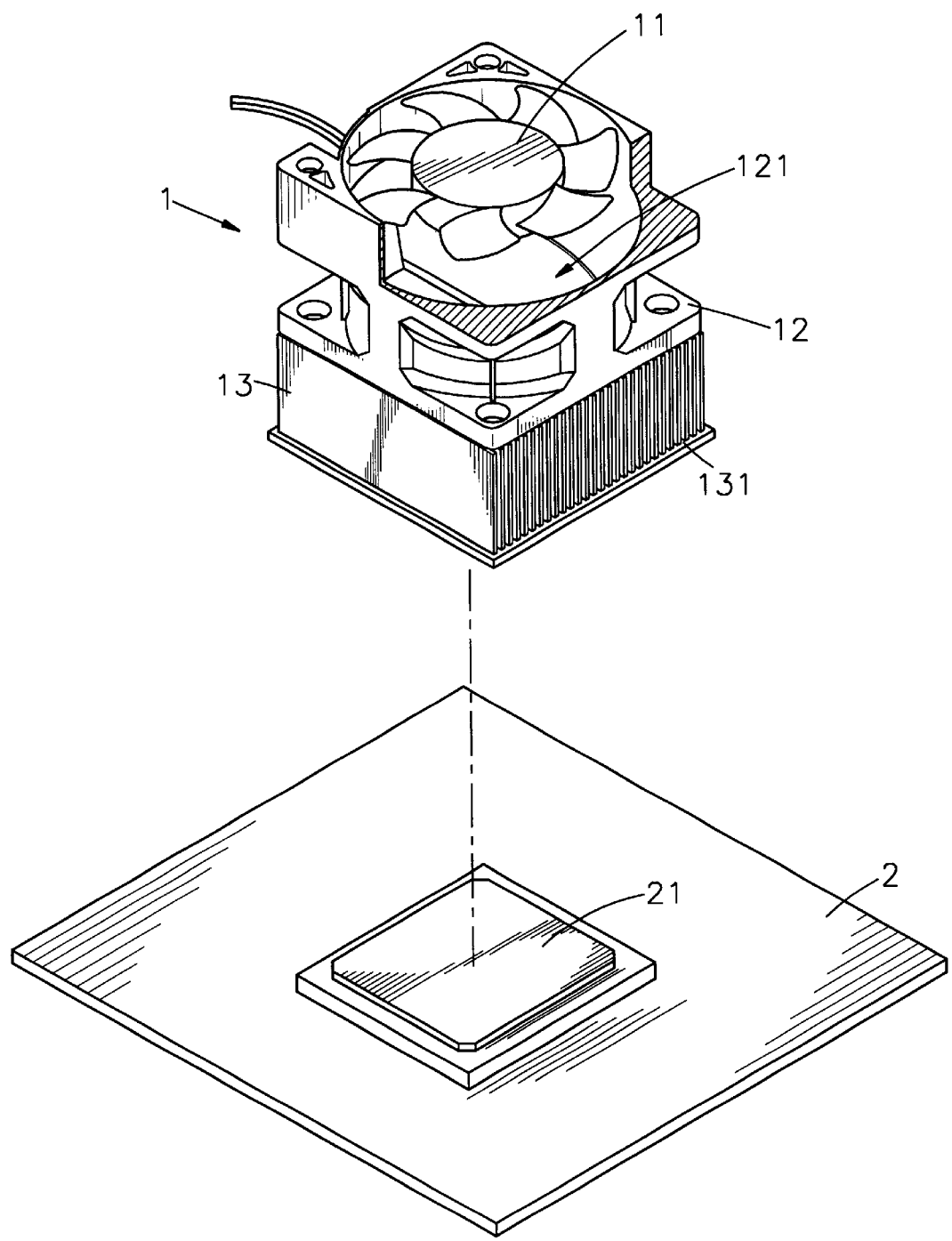
FIG. 1 is an elevational view of a CPU cooling structure according to the first embodiment of the present invention.

Referring to FIGS. from 1 through 3, a CPU cooling structure 1 in accordance with the first embodiment of the present invention is shown comprised of an axial-flow fan 11, a flow guide 12, and a heat sink 13. The heat sink 13 is mounted on a motherboard 2 and maintained in close contact with the CPU 21 on the motherboard 2 for absorbing heat from the CPU 21. The axial-flow fan 11 is fixedly mounted inside the flow guide 12, i.e., the flow guide 12 serves as a fan case holding the fan 11 on the inside. The flow guide 12 is supported on the heat sink 13 and adapted to guide the axial flow of air from the axial-flow fan 11 toward the heat sink 13 to carry heat away from the heat sink 13. The flow guide 12 comprises two flow guide holes 121, and a vertical air damper 122 suspended in between the flow guide holes 121 and adapted for guiding the axial flow of air from the fan 11 toward the center area of the heat sink 13, enabling air to flow sideways through air passages 131 in reversed directions to the outside of the heat sink 13 to carry heat away from the heat sink 13.

Figure 2:
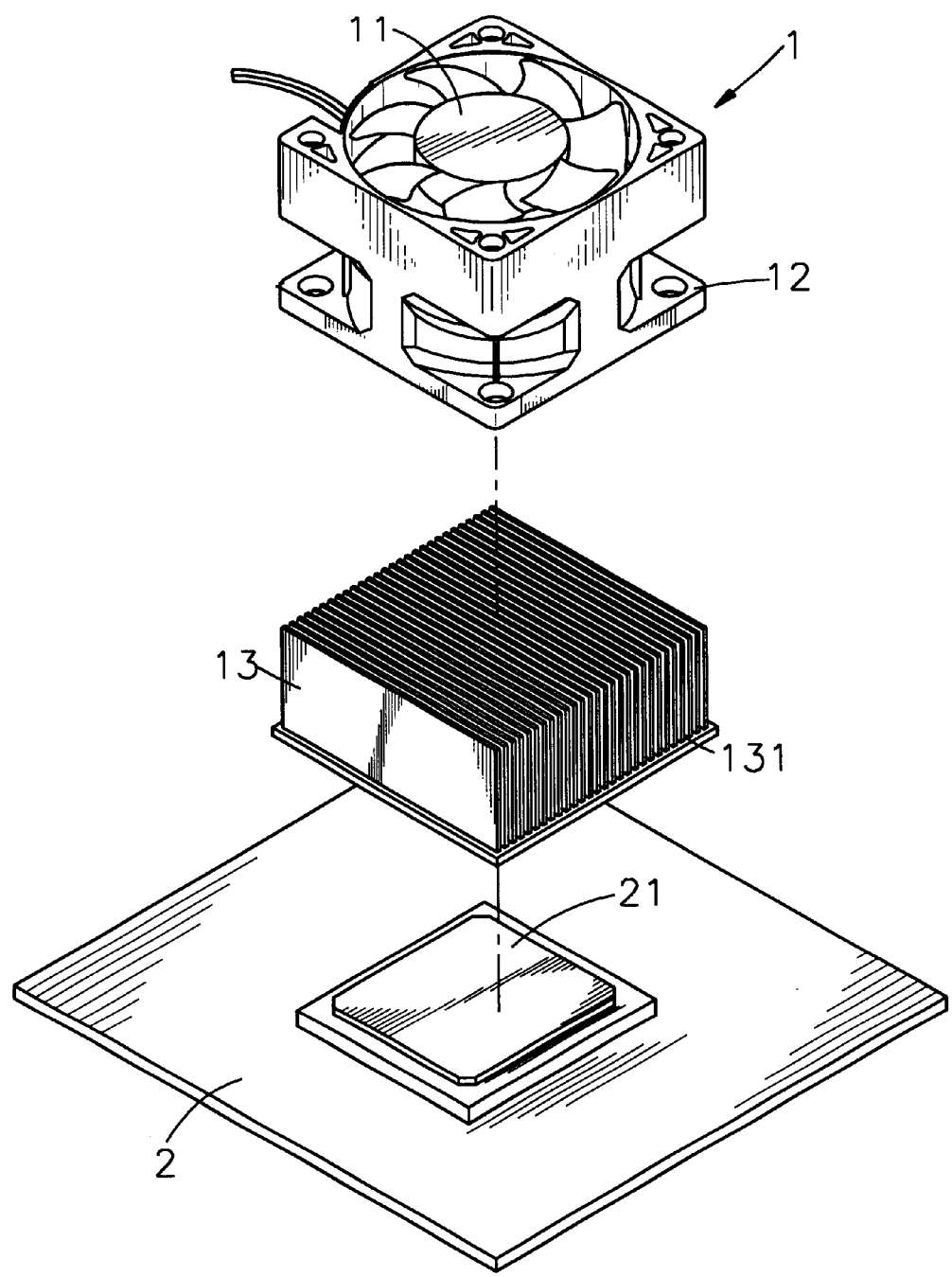
FIG. 2 is an exploded view of the CPU cooling structure according to the first embodiment of the present invention.

Referring to FIGS. 2 and 3 again, the vertical air damper 122 is a spirally curved guide plate having a with-wind face 1221 and an against-wind face 1222 at each of two opposite sides thereof. When the axial flow of air passed from the axial-flow fan 11 into the flow guide holes 121 over the two opposite sides of the vertical air damper 122, a relatively strong wind A is formed around each with-wind face 1221, and a relatively weak wind B is formed around each against-wind face 1222. Because of uneven air pressure between the strong wind A and the weak wind B, the strong wind A flows toward the weak wind B, and then the mix currents of air flow vertically toward the center area of the heat sink 13 and then to the outside of the heat sink 13 through the air passages 131 to carry heat away from the heat sink 13.

Figure 3:
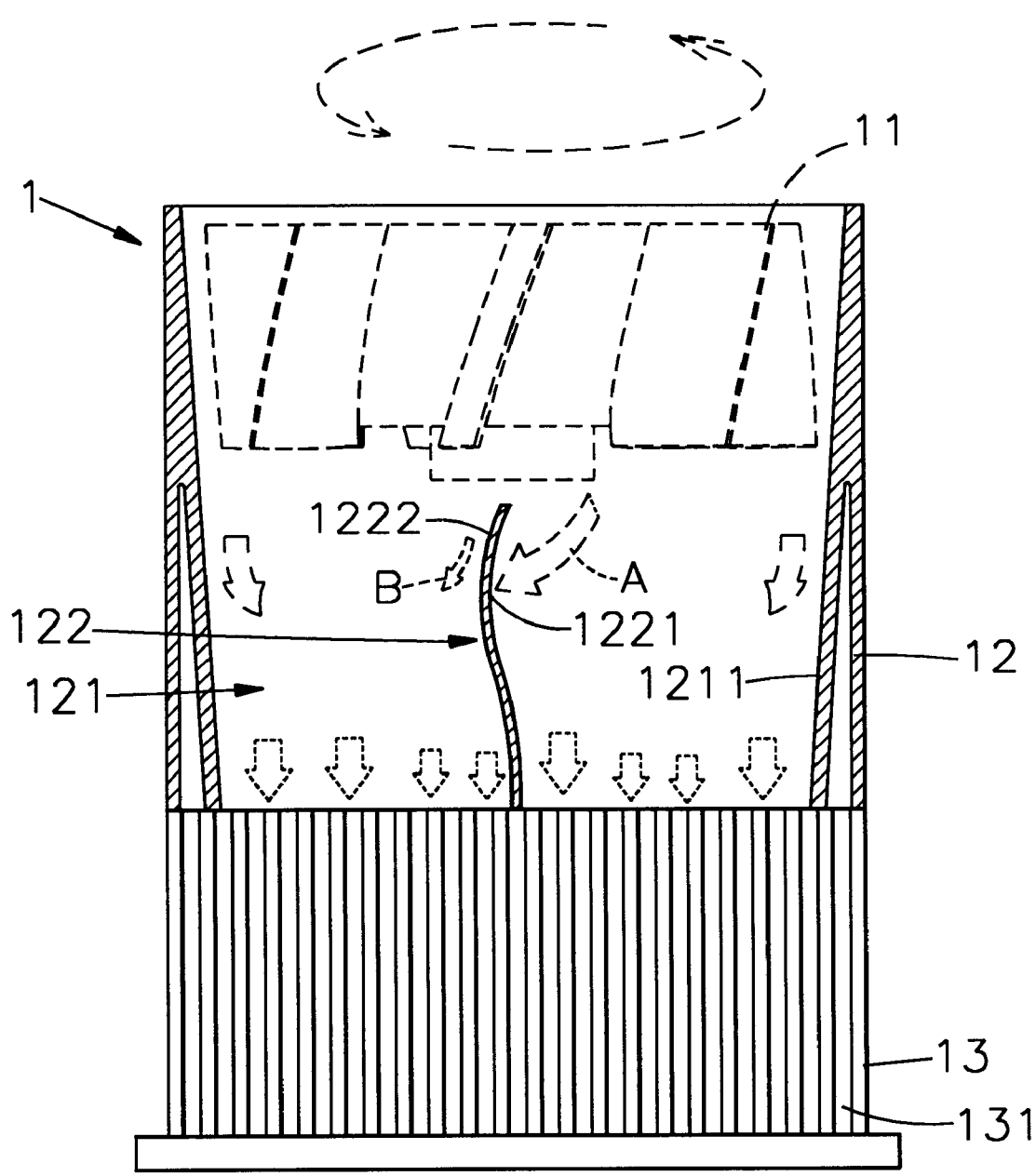
FIG. 3 is a side view in section of the CPU cooling structure according to the first embodiment of the present invention, showing air passed over the vertical air damper toward the center area of the heat sink.
Figure 4:
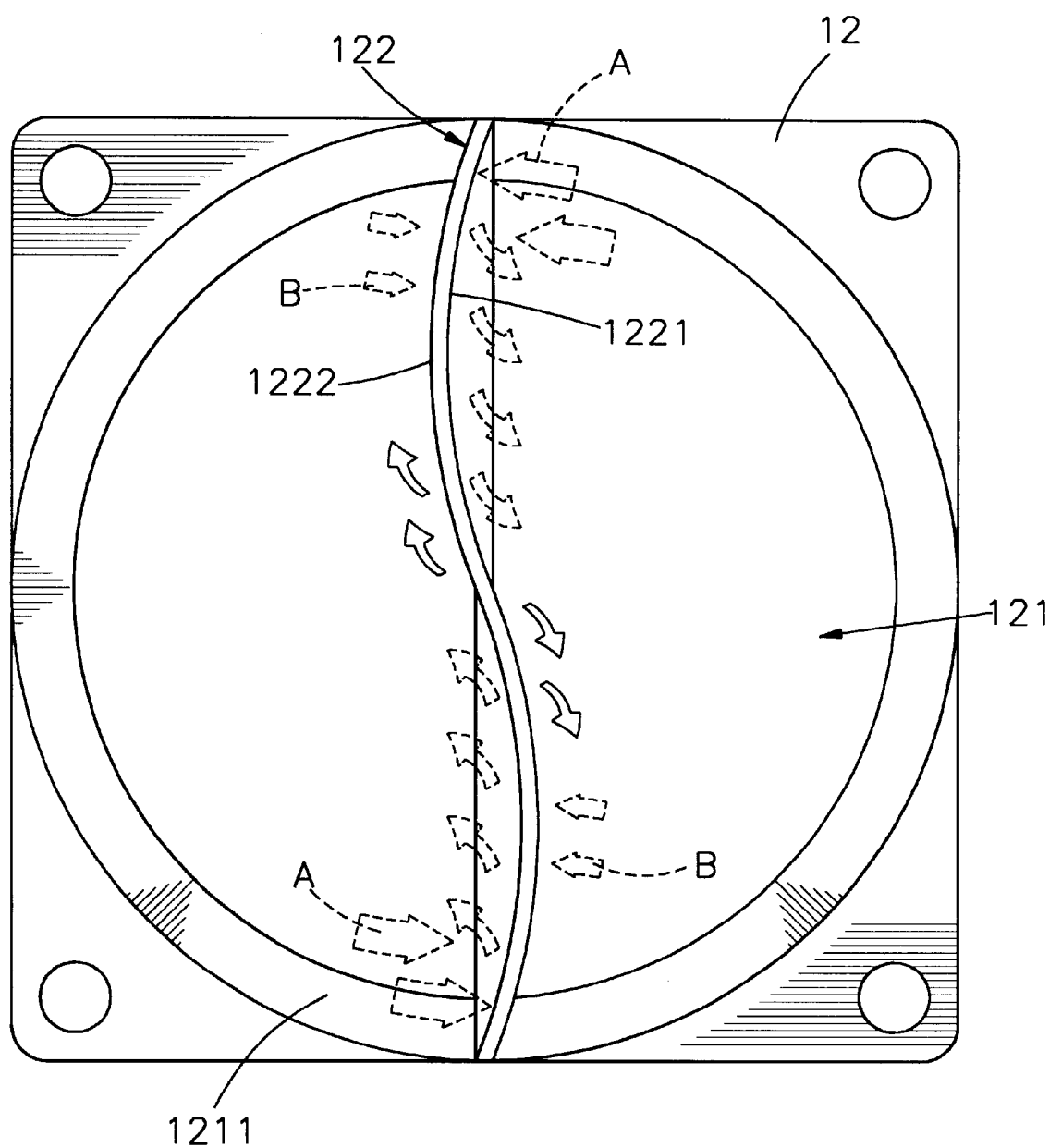
FIG. 4 is a top view in an enlarged scale of FIG. 3.

Referring to FIGS. 3 and 4, the inside wall 1211 (the inside wall 1211 define a circular hole that is separated into the aforesaid flow guide holes 121 by the vertical air damper 122) of the flow guide 12 is tapered, having a diameter gradually reduced in direction from the axial-flow fan 11 toward the heat sink 13 for concentrating the currents of air into the center area of the heat sink 13.

Figure 5:
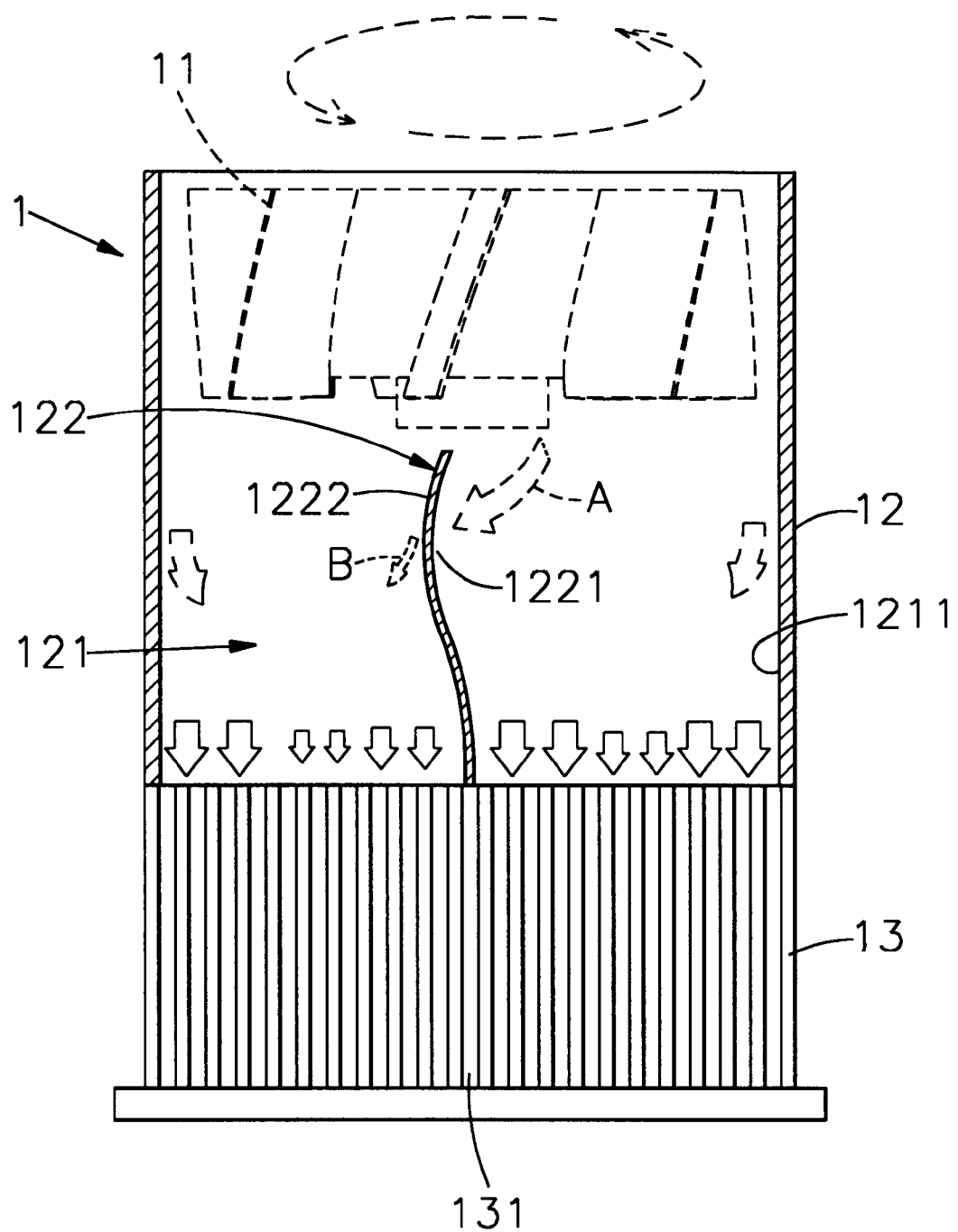
FIG. 5 is a side view in section of a CPU cooling structure according to the second embodiment of the present invention, showing air passed over the vertical air damper toward the center area of the heat sink.

FIG. 5 shows a CPU cooling structure 1 according to the second embodiment of the present invention. According to this embodiment, the inside wall 1211 of the flow guide 12 is a straight wall that guides air vertically downwards toward the center area of the heat sink 13.

Figure 6:
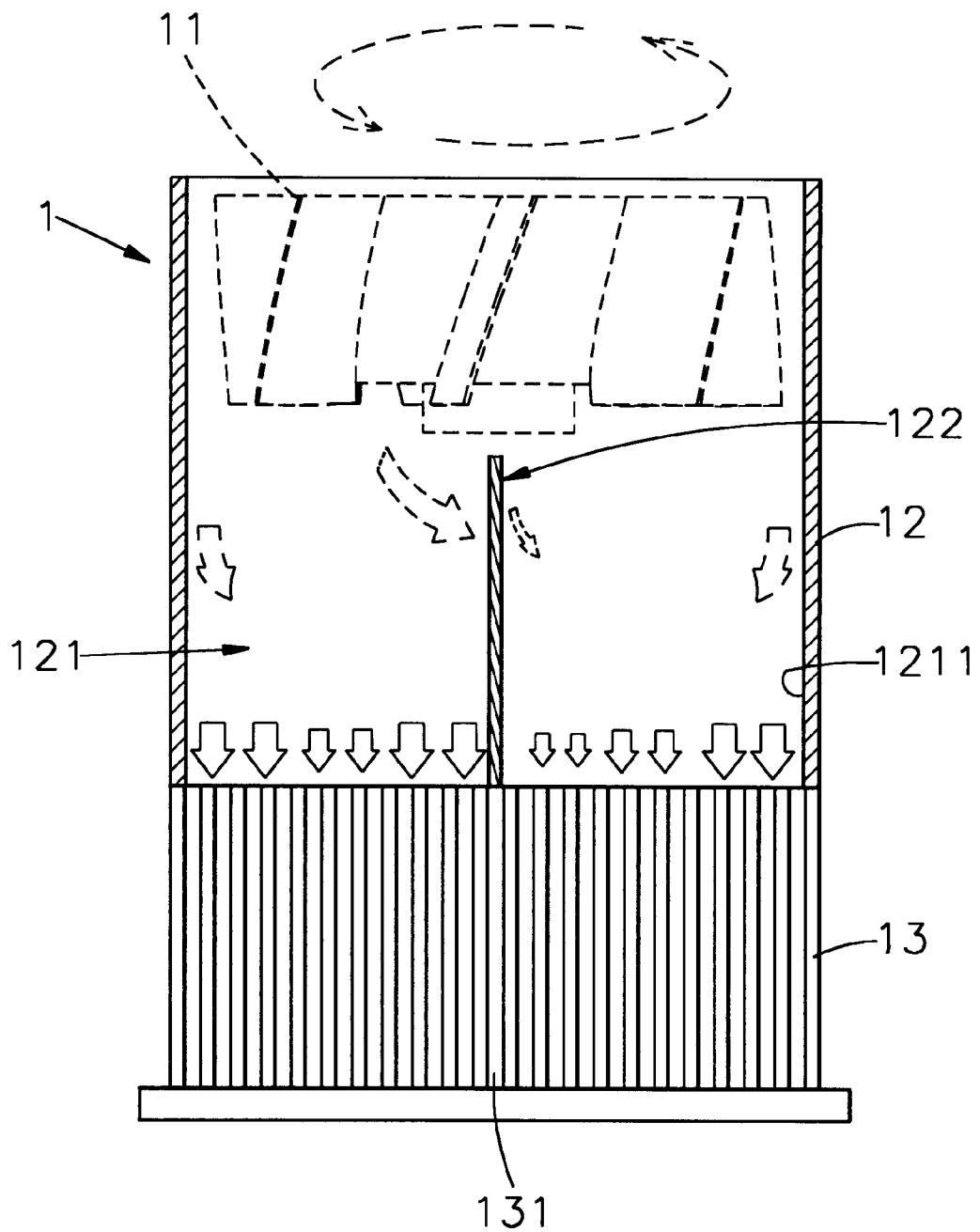
FIG. 6 is a side view in section of a CPU cooling structure according to the third embodiment of the present invention, showing air passed over the vertical air damper toward the center area of the heat sink.

FIG. 6 shows a CPU cooling structure 1 according to the third embodiment of the present invention. According to this embodiment, the vertical air damper 122 of the flow guide 12 is a flat plate vertically suspended in between the flow guide holes 121 inside the flow guide 12 for guiding spirally moved axial flow of air toward the center area of the heat sink 13, enabling air to flow sideways through air passages 131 in reversed directions to the outside of the heat sink 13 to carry heat away from the heat sink 13.

Figure 7:
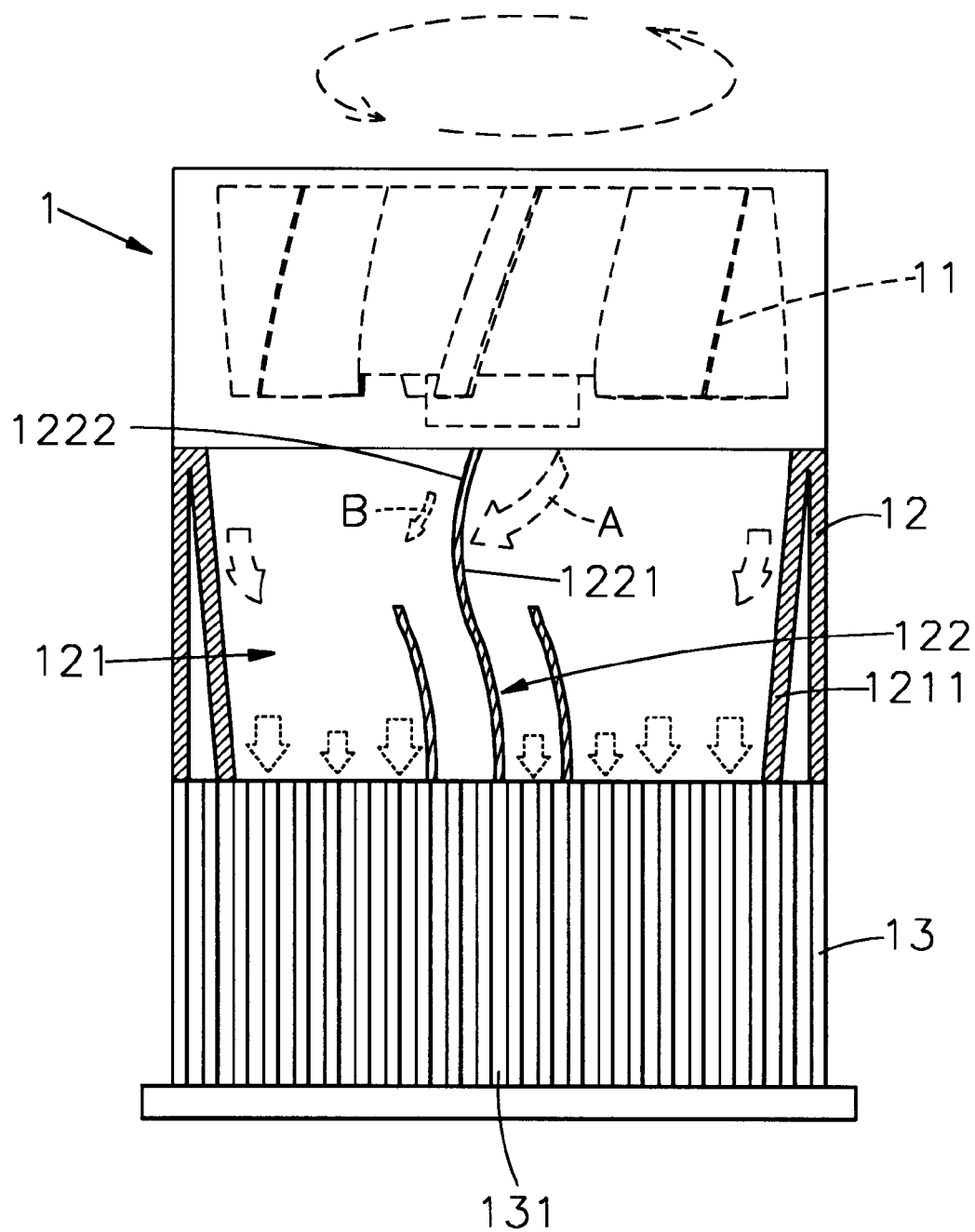
FIG. 7 is a side view in section of a CPU cooling structure according to the fourth embodiment of the present invention, showing air passed over the vertical air damper toward the center area of the heat sink.
Figure 8:
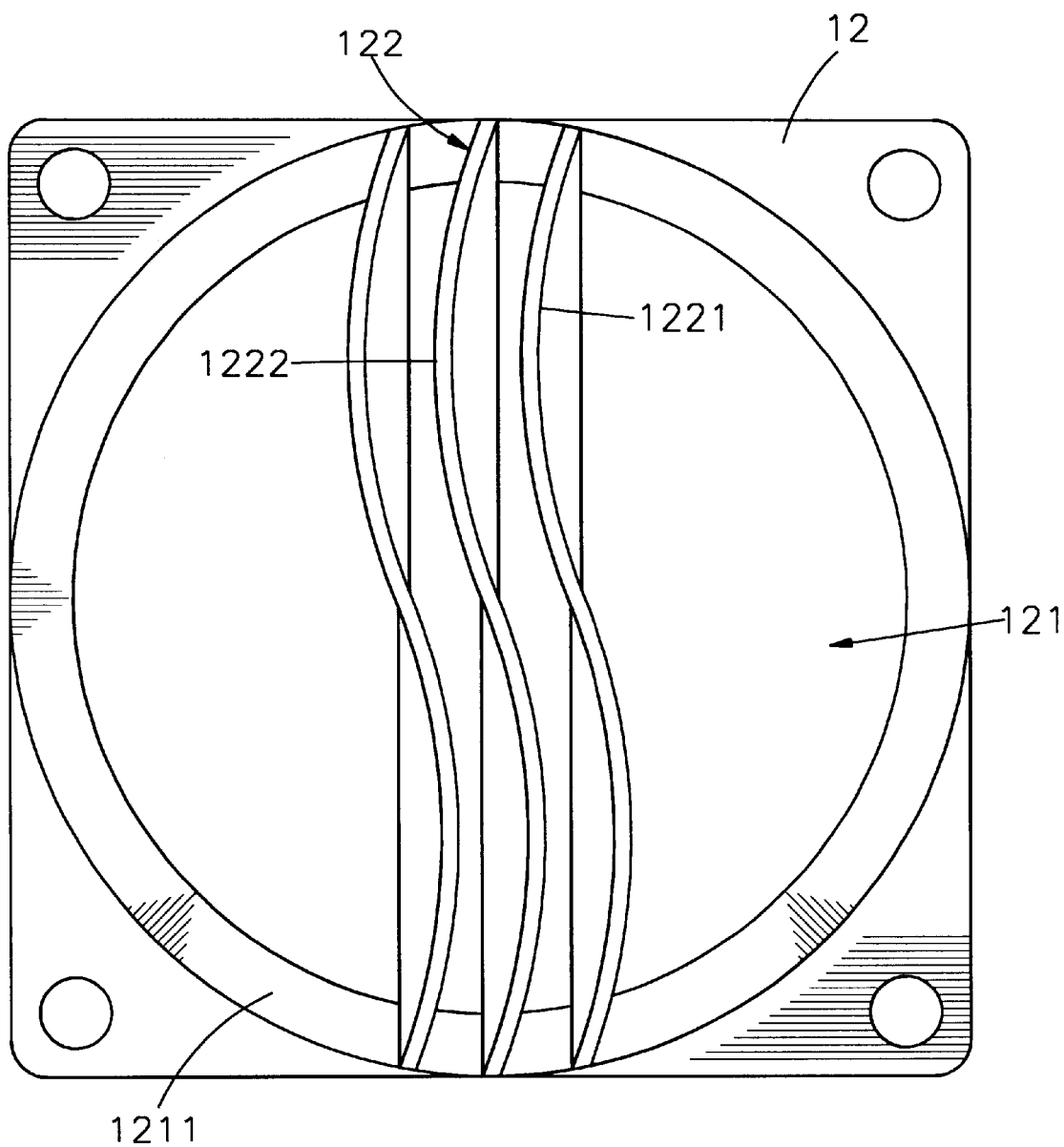
FIG. 8 is a top view in an enlarged scale of FIG. 7.

FIGS. 7 and 8 show a CPU cooling structure 1 according to the fourth embodiment of the present invention. According to this embodiment, the flow guide 12 comprises a plurality of vertical air dampers 121 suspended on the inside in between the flow guide holes 121 and arranged in parallel. The air dampers 121 are spirally curved for guiding air toward the center area of the heat sink 13. The middle air damper is relatively taller than the air dampers at two sides.

Figure 9:
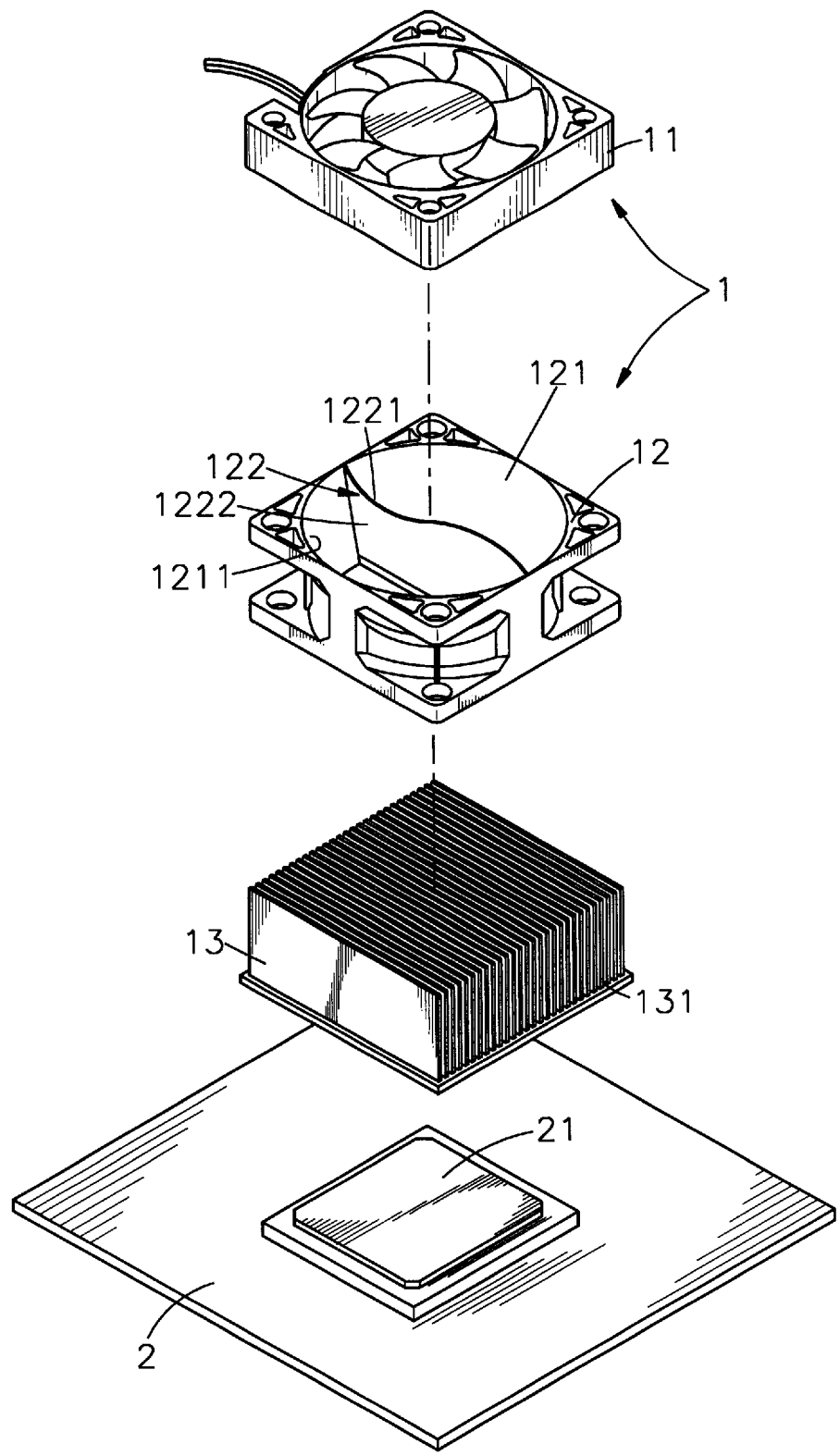
FIG. 9 is an exploded view of a CPU cooling structure according to the fifth embodiment of the present invention.
Figure 10:
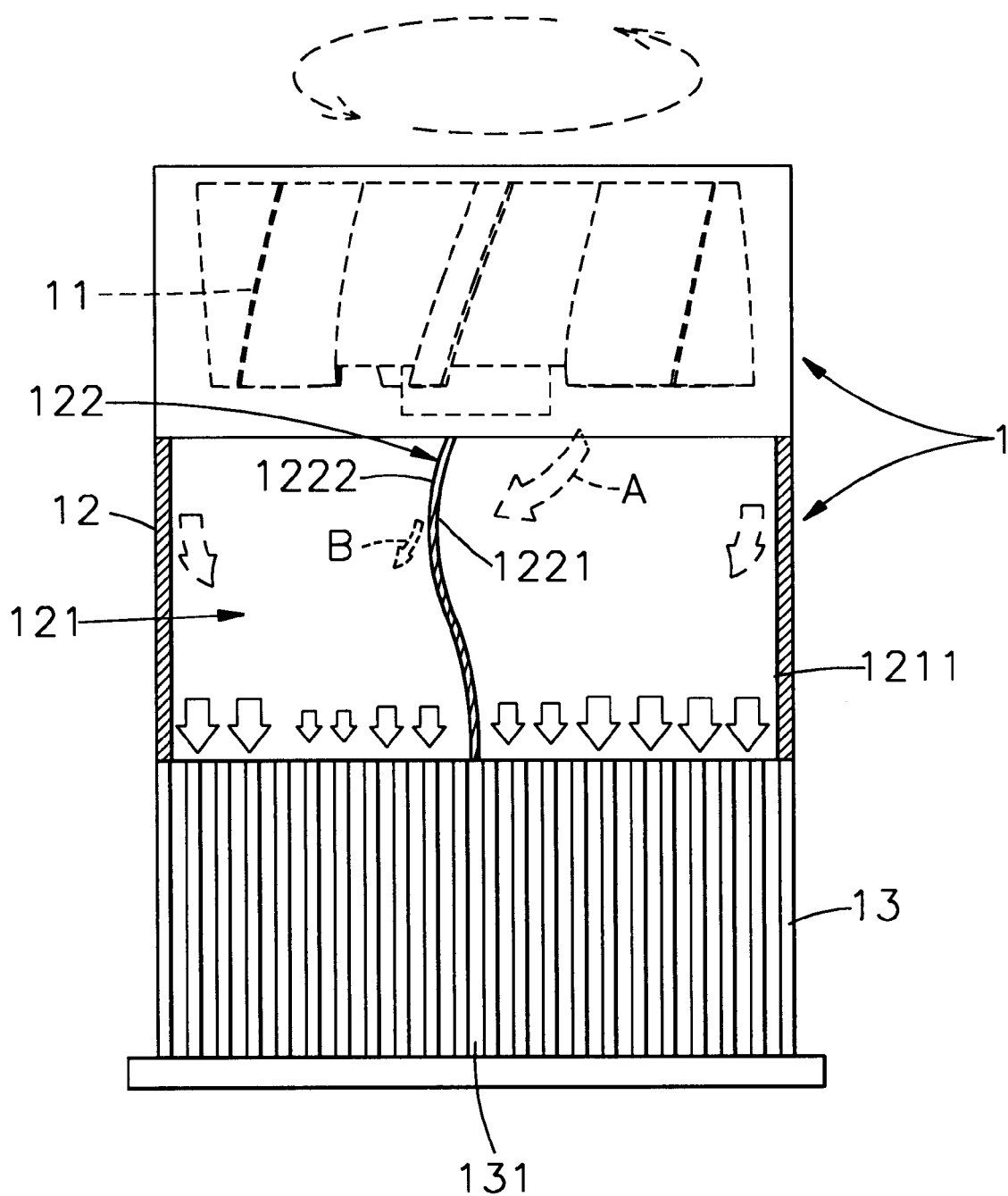
FIG. 10 is a side view in section of the CPU cooling structure according to the fifth embodiment of the present invention, showing air passed over the vertical air damper toward the center area of the heat sink.

FIGS. 9 and 10 show a CPU cooling structure 1 according to the fifth embodiment of the present invention. According to this embodiment, the fan 11 and the flow guide 12 are two separate members. The fan 11 is mounted on the top of the flow guide 12. The vertical air damper 122 of the flow guide 12 is a wave-like damper curving in horizontal direction and having a with-wind face 1221 and an against-wind face 1222 at each of two opposite sides thereof.

Figure 11:
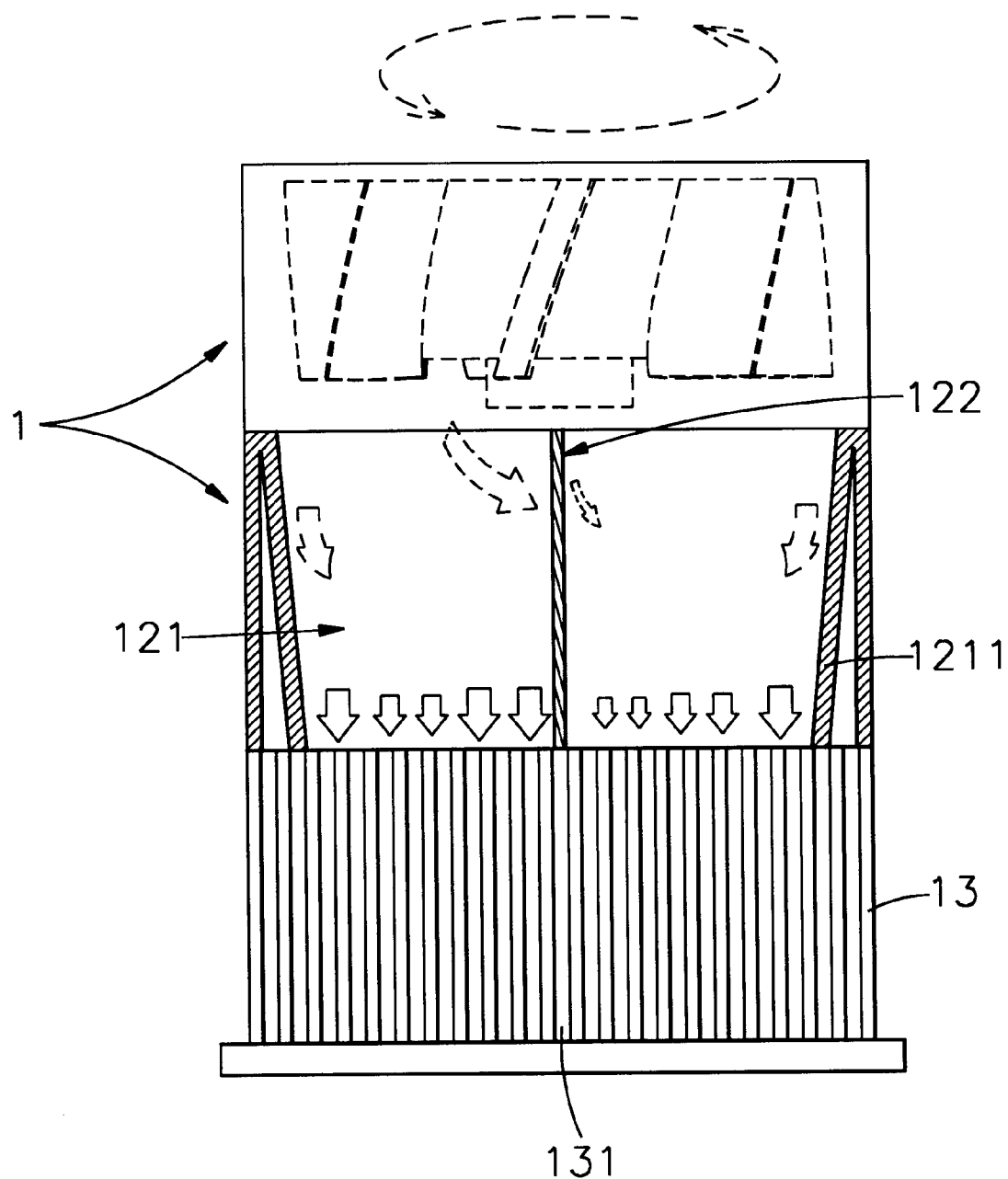
FIG. 11 is a side view in section of a CPU cooling structure according to the six embodiment of the present invention, showing air passed over the vertical air damper toward the center area of the heat sink.

FIG. 11 shows a CPU cooling structure according to the sixth embodiment of the present invention. According to this embodiment, the fan 11 and the flow guide 12 are two separate members. The fan 11 is mounted on the top of the flow guide 12. The vertical air damper 122 of the flow guide 12 is a flat plate vertically suspended in between the air guide holes 121 within the tapered inside wall 1211 of the flow guide 12.

Figure 12:
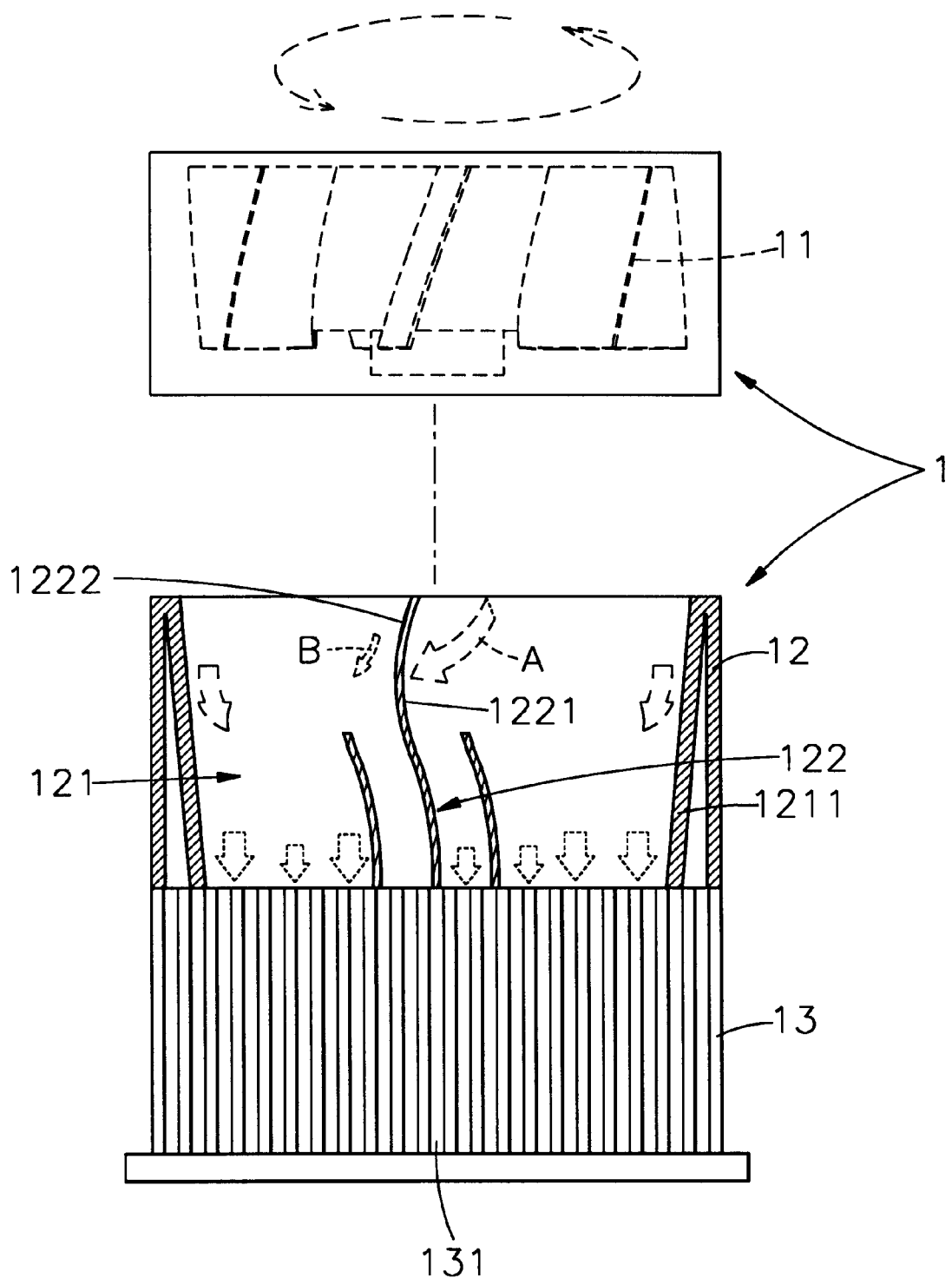
FIG. 12 is a side view in section of a CPU cooling structure according to the seventh embodiment of the present invention, showing air passed over the vertical air damper toward the center area of the heat sink.
Figure 13:
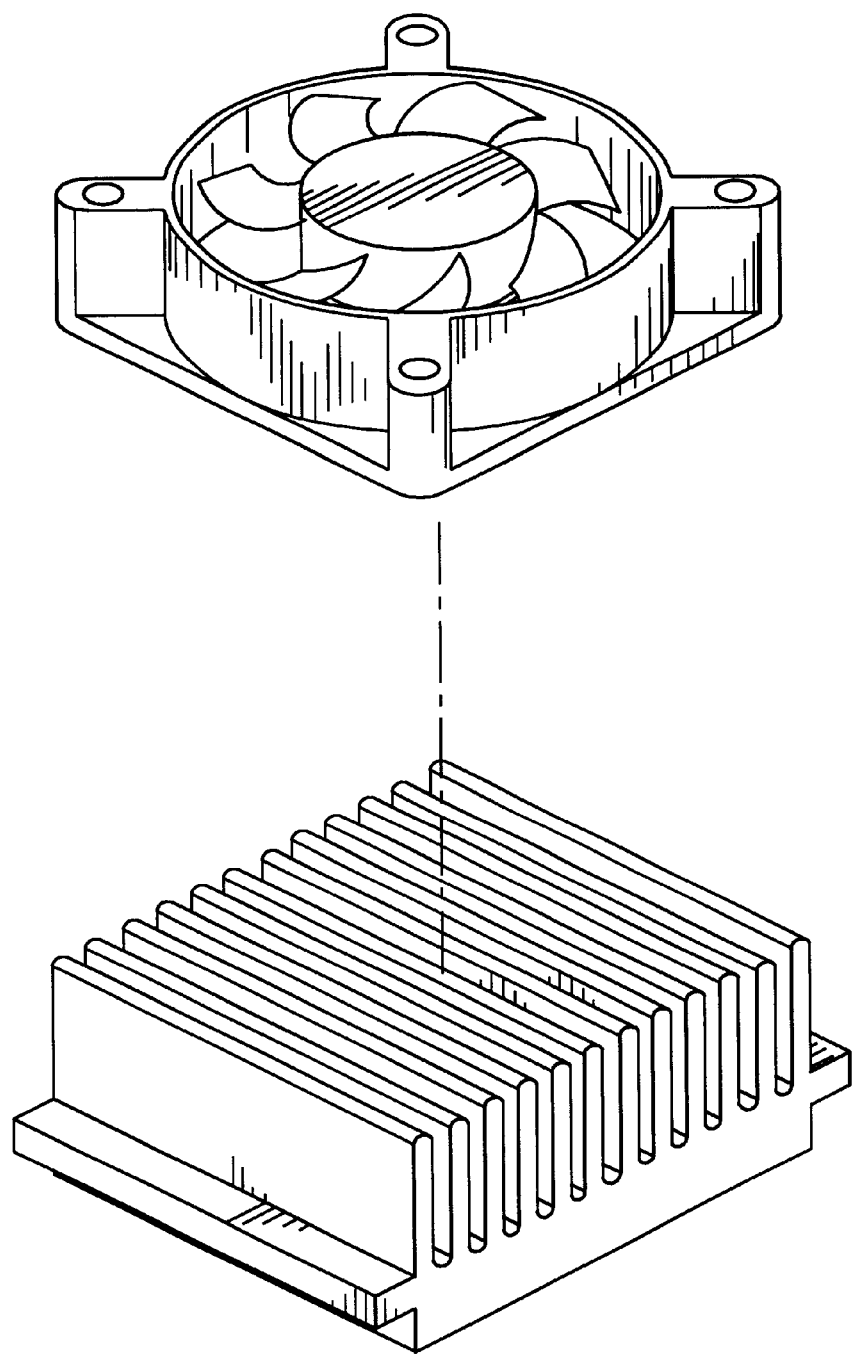
FIG. 13 is an exploded view of a CPU cooling structure according to the prior art.

FIG. 12 shows a CPU cooling structure according to the seventh embodiment of the present invention. According to this embodiment, the fan 11 and the flow guide 12 are two separate members. The fan 11 is mounted on the top of the flow guide 12. The flow guide 12 comprises a plurality of, for example three curved air dampers 122 vertically suspended in between the air guide holes 121 within the tapered inside wall 1211 of the flow guide 12 and arranged in parallel.

A prototype of CPU cooling structure has been constructed with the features of the annexed drawings of FIGS. 1~12. The CPU cooling structure functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A CPU cooling structure comprising a heat sink adapted for mounting on a motherboard to absorb heat from a CPU of the motherboard, and a fan provided above said heat sink and adapted for causing currents of air toward said heat sink to carry heat away from said heat sink, wherein a flow guide is mounted on said heat sink to support said fan above said heat sink, said flow guide comprising two flow guide holes, and at least one air damper suspended in between said flow guide holes and adapted for guiding air from said fan toward the center area of said heat sink for enabling air to flow through air passages in said heat sink in reversed directions to carry heat away from said heat sink.

2. The CPU cooling structure as claimed in claim 1, wherein the number of said at least one vertical air damper is 1.

3. The CPU cooling structure as claimed in claim 1, wherein said at least one vertical air damper includes a middle air damper and a plurality of side air dampers symmetrically arranged at two opposite sides in parallel to said middle air damper, said middle air damper being taller than said side air dampers.

4. The CPU cooling structure as claimed in claim 1 wherein said at least one vertical air damper each has a wave-like profile curving in horizontal direction, and a with-wind face and an against-wind face at each of two opposite sides thereof.

5. The CPU cooling structure as claimed in claim 1, wherein said at least one air damper each is shaped like a flat board.

6. The CPU cooling structure as claimed in claim 1, wherein said flow guide comprises a tapered inside wall defining with said at least one air damper said flow guide holes.

7. The CPU cooling structure as claimed in claim 1, wherein said flow guide comprises a straight inside wall defining with said at least one air damper said flow guide holes.

8. The CPU cooling structure as claimed in claim 1, wherein said fan is formed integral with said flow guide.

9. The CPU cooling structure as claimed in claim 1, wherein said fan and said flow guide are separate members detachably fastened together.

* * * * *